United States Patent

Kydd

[11] Patent Number: 6,036,889
[45] Date of Patent: Mar. 14, 2000

[54] ELECTRICAL CONDUCTORS FORMED FROM MIXTURES OF METAL POWDERS AND METALLO-ORGANIC DECOMPOSITION COMPOUNDS

[75] Inventor: Paul H. Kydd, Lawrenceville, N.J.

[73] Assignee: Parelec, Inc., Rocky Hill, N.J.

[21] Appl. No.: 09/034,069

[22] Filed: Mar. 3, 1998

Related U.S. Application Data

[62] Division of application No. 08/501,393, Jul. 12, 1995, Pat. No. 5,882,722.

[51] Int. Cl.⁷ .............................. H01B 1/02; C25D 5/02
[52] U.S. Cl. ........................ 252/512; 252/513; 252/514; 252/519.3; 252/520.3; 427/123; 427/125; 427/226; 427/427
[58] Field of Search ................................ 252/512–514, 252/503, 510, 519.2, 519.3; 427/123, 125, 226, 229, 191, 192, 197, 196, 199

[56] References Cited

U.S. PATENT DOCUMENTS

| | | |
|---|---|---|
| 4,130,671 | 12/1978 | Naghesh et al. |
| 4,186,244 | 1/1980 | Deffeyes et al. ........................ 428/570 |
| 4,381,945 | 5/1983 | Nair ...................................... 106/1.14 |
| 4,463,030 | 7/1984 | Deffeyes et al. ........................ 427/216 |
| 4,487,811 | 12/1984 | Eichelberger et al. ................. 428/546 |
| 4,548,879 | 10/1985 | St. John et al. ......................... 427/96 |
| 4,599,277 | 7/1986 | Brownlow et al. ...................... 428/552 |
| 4,650,108 | 3/1987 | Gallagher ................................ 228/124 |
| 4,775,439 | 10/1988 | Seeger, Jr. et al. ..................... 156/151 |
| 4,808,274 | 2/1989 | Nguyen .................................... 204/15 |
| 4,859,241 | 8/1989 | Grundy .................................. 106/1.14 |
| 5,059,242 | 10/1991 | Firmstone et al. ..................... 106/1.23 |

(List continued on next page.)

FOREIGN PATENT DOCUMENTS 52-68507   7/1977   Japan.

OTHER PUBLICATIONS

Materials, Silver Ink for Jet Printing, NASA Tech Briefs, Aug. 1989.

Liquid Ink Jet Printing with MOD Inks for Hybrid Microcircuits K.F. Teng, and Robert W. Vest, IEEE Transactions on Components, Hybrids and Manufacturing Technology, vol. CHMT–12(4), 545–549 (1987).

Ink Jet Printing of Hybrid Circuits, R.W. Vest, Tweedell and B.C. Buchanan, "Hybrid Microelectronics" 6, 261–267 (1983).

ITT Cuts Costs of PC Board Manufacturing, Kenneth Dreyfack, Electronics, vol. 52 No. 17, (Aug. 16, 1979).

*Primary Examiner*—Mark Kopec
*Assistant Examiner*—Derrick G. Hamlin
*Attorney, Agent, or Firm*—Woodbridge & Associates; Richard C. Woodbridge; Stuart H. Nissim

[57] ABSTRACT

The present invention relates to a thick film formed of a mixture of metal powders and metallo-organic decomposition (MOD) compounds in an organic liquid vehicle and a process for advantageously applying them to a substrate by silk screening or other printing technology. The mixtures preferably contain metal flake with a ratio of the maximum dimension to the minimum dimension of between 5 and 50. The vehicle may include a colloidal metal powder with a diameter of about 10 to about 40 nanometers. The concentration of the colloidal metal in the suspension can range from about 10 to about 50% by weight. The MOD compound begins to decompose at a temperature of approximately about 200° C. to promote consolidation of the metal constituents and bonding to the substrate which is complete at temperatures less than 450° C. in a time less than six minutes. The mixtures can be applied by silk screening, stencilling, gravure or lithography to a polymer-based circuit board substrate for producing rigid and flexible printed wiring boards in a single operation with negligible generation of hazardous wastes. The same mixtures can be used in place of solder to assemble circuits by bonding electrical components to conductors as well as to make the conductors themselves.

14 Claims, 10 Drawing Sheets

U.S. PATENT DOCUMENTS

| | | | |
|---|---|---|---|
| 5,071,826 | 12/1991 | Anderson | 505/1 |
| 5,075,262 | 12/1991 | Nguyen et al. | 501/19 |
| 5,173,330 | 12/1992 | Asano et al. | 427/558 |
| 5,183,784 | 2/1993 | Nguyen et al. | 501/19 |
| 5,250,229 | 10/1993 | Hara et al. | 252/518 |
| 5,270,368 | 12/1993 | Lent et al. | 524/236 |
| 5,338,507 | 8/1994 | Anderson et al. | 505/470 |
| 5,378,408 | 1/1995 | Carroll et al. | 252/514 |
| 5,395,452 | 3/1995 | Kobayashi et al. | 118/715 |

ELECTRICAL CONDUCTORS FORMED FROM MIXTURES OF METAL POWDERS AND METALLO-ORGANIC DECOMPOSITION COMPOUNDS

This application is a divisional or Ser. No. 08/501,393, filed Jul. 12, 1995, now U.S. Pat. No. 5,882,722.

The United States Government has a royalty-free license in this invention for its own use and the right in limited circumstances to require the patent owner to license others as provided for by the terms of the Small Business Innovation and Research Contract N00014-94-C-0236.

BACKGROUND OF THE INVENTION

1. Field of the Invention

This invention relates to electronic circuits and particularly to printed circuits on conventional polymer-based substrates.

2. Description of the Related Art

Printed circuits are universally used to interconnect and "package" active and passive electronic components to perform a myriad of useful functions. These circuits can be of the rigid type which consist of laminated "boards" usually of glass-reinforced epoxy, but also of paper-phenolic and other constructions. There are also flexible circuits based on unreinforced polymer films such as Kapton polyamide manufactured by DuPont. In both cases the circuits are produced by a combination of etching and deposition technologies based on the use of photoresists which are exposed to light and developed to permit a pattern of conductors to be etched and/or plated on the substrate.

These conventional processes are described, for example, in "Printed Circuit Board Basics", M. Flatt, Miller Freeman, San Francisco, 1992. The conventional technology requires many steps of plating, both electroless and electrolytic, and etching to produce a finished board. At each of these stages there is opportunity for error, and hazardous wastes are generated in many of the processes. The principal wastes can be the result of etching away unwanted conductor material to leave behind the desired conductor pattern, and from spent solutions from electrolytic plating of copper, tin and lead, as well as spent electroless plating solutions. The latter are the most difficult to handle because of the presence of formaldehyde reducing agent, a known carcinogen, as well as the toxic heavy metals.

There is a major emphasis on speed of response in the circuit board industry, and technology which can reduce the time to produce prototype boards and facilitate modifications with minimum tooling change, as well as reduce in-process inventory and manufacturing time would be advantageous. In particular, a low temperature analog of "thick film" technology which is used to print circuit conductors onto ceramic substrates which are fired at high temperatures is desirable.

The ideal solution to this problem would be an ink which could be applied only where a conductor is needed by a simple printing technology to any type of printed circuit substrate material, and which could be cured at a temperature which would not damage the substrate. The conductor should have an electrical conductivity greater than half that of the bulk metal and should be strongly adherent to the polymer substrate after curing. This ink would allow the production of circuit boards at high production rates with the generation of no hazardous waste by a simple two-step print and heat process.

The primary problem in the industry is the requirement for high electrical conductivity with a low enough curing temperature to be compatible with the polymer-based circuit boards. Conventional solutions to the problem provide low temperature conductive epoxies with poor electrical conductivity and high temperature thick film inks with good electrical conductivity which can only be used on ceramic substrates. These small, expensive and specialized substrates can withstand the required thick film ink firing temperatures of more than 650° C. and usually above 850° C. An ink which could duplicate this performance on polymer-based substrates at approximately 250° to 350° C. would permit application of this technology broadly in the 20 billion dollar worldwide rigid circuit board industry and the one billion dollar worldwide flexible circuit industry.

"Thick film" technology, as described by R. W. Vest in "Electronic Ceramics", R. Breckenridge, ed., 1991, is routinely practiced to produce hybrid circuits on ceramic substrates. The conductor patterns are created by silk screening or stencil printing thick film pastes or inks onto ceramic substrates and firing them at temperatures of 850° to 1100° C. to reduce the metal-containing inks to metal. An example of such inks are silver-palladium compositions described by Wang, Dougherty, Huebner and Pepin, J. Am. Ceram. Soc. 77(12), 3051–72 (1994). Typically thick film inks contain metal powders, an inorganic glass binder and a vehicle consisting of a polymer binder and a solvent. The vehicle provides the correct consistency for screen printing and consists typically of a polymer such as ethyl cellulose, hydrogenated rosin or polyacrylics dissolved in a low volatility solvent. Common solvents are terpineol, dibutyl carbitol and various glycol ethers and esters. The inks are applied to ceramic substrates by screen printing, dried to drive off the solvent and heat treated, usually in a belt furnace, to decompose the polymer binder and fuse the metal and the inorganic glass binder. The glass phase provides the bond to the substrate which is usually alumina, and the metal provides the electrical conductivity. Typically the conductors have a striated cross section with layers of glass alternating with layers of metal. The glass tends to concentrate at the ceramic interface and the metal at the air interface. The conductivity is typically one half to one quarter that of the bulk metal.

A number of thick film compositions contain surfactants to improve screenability and stability of the metal powder dispersions. Often these surfactants are metallo-organic compounds such as soaps of carboxylic acids. These are convenient in that they decompose at relatively low temperature to deposit the metal or its oxide which can perform a useful function in the fired conductor.

For example, U.S. Pat. Nos. 5,071,826 ('826 patent) issued on Dec. 10, 1991 and 5,338,507 ('507 patent) issued on Aug. 16, 1994 to J. T. Anderson, V. K. Nagesdh and R. C. Ruby and assigned to Hewlett Packard Co. of Palo Alto, Calif. describe the addition of silver neodecanoate to superconducting oxide mixtures to increase the critical current for multicrystalline ceramic superconductor materials. The neodecanoate is decomposed to the metal at 300° C. to coat the superconducting grains with silver. The coated grains are then sintered and oxidized at 600–800° C. to produce an oxide superconductor of enhanced strength and critical current.

The addition of titanate to thick film conductors by decomposition of an organo-metallic titanate is described by K. M. Nair in U.S. Pat. No. 4,381,945, assigned to E. I. DuPont de Nemours and Co. Wilmington, Del.

U.S. Pat. No. 4,599,277 relates to a process for adding organometallic compounds to thick film inks to increase the densification temperature of the metal to match that of the ceramic substrate at 850–950° C.

Other conventional thick film paste compositions containing silver flake, glass frit and silver resinates, which are carboxylic acid soaps, as well as surfactants such as Triton X 100, are described in U.S. Pat. Nos. 5,075,262, and 5,183,784. The metal resinate was found to promote adhesion and minimize cracks and voids in bonding semiconductor dies to a ceramic substrate at 350–450° C.

U.S. Pat. No. 4,130,671, assigned to the U.S. Department of Energy, discloses a similar composition of glass frit and silver resinate which was decomposed at low temperature to provide silver-coated glass particles similar to the superconductor described in the '826 and '507 patents. The particles are applied to a substrate either before or after decomposition of the resinate and fired in an oxidizing atmosphere at 500° to 700° C. to provide a conductor of metal-coated glass particles.

Still other conventional thick film compositions of glass and metal powders in an organic vehicle but without the resinate are described in U.S. Pat. Nos. 5,250,229 and 5,378,408 assigned to DuPont, de Nemours and Co. The above described conventional thick film compositions have the shortcoming of requiring high temperatures, i.e., greater than about 450° C. to bind the composite to the substrate.

To create a low temperature analog of the thick film process, it will be necessary to find a new mechanism to obtain adhesion and cohesion of the deposited metal which can operate at temperatures below 450° C., which is the extreme upper temperature limit that polymers can tolerate. The use of inorganic glass powder binders which are universally used in conventional thick film inks is not possible in this application because none of them melt at a low enough temperature, and the glass will not bond to the metal or to the polymer substrates.

Some approaches to creating electrically conductive inks for application to polymer substrates have been described. The most common one is the creation of conductive epoxies or conductive inks by incorporating metal powder, usually silver powder, in an organic matrix. This is a major industry with products available from Ablestik, AIT, Hokurika, M-Tech, Thermoset, Epoxy Technology and Ferro, among others. These materials can be printed on circuit boards, and they have good adhesion. An example of the application of this technology was described in an article by K. Dreyfack in Electronics 52(17), 2E–4E, 1979, on Societie des Produits Industrielles ITT who silk screened silver and graphite-based conductors of this type onto rigid and flexible circuits. The problem with this approach is that the inks conduct by random contacts between powder grains in the organic matrix, and the conductivity is poor. Typical values of the resistivity, which is the reciprocal of conductivity, are 40 to 60 microhm cm, compared to bulk silver at 1.59 microhm cm and high temperature thick film conductors at 3–6 microhm cm. A typical resin-bonded copper powder conductor is described in Japanese Patent Application 52-68507, June, 1977.

U.S. Pat. No. 4,775,439, assigned to Amoco Corp., Chicago, Ill., describes a more elaborate approach with the same results. A metal powder and binder are applied to a substrate and dried. The trace is then covered by a polymer film which is adhesively laminated to the substrate to hold the conductor in place. However, this patent does not address the problem of obtaining electrical conductivity comparable to bulk metal.

Near bulk conductivity has been achieved at low temperature by decomposing metallo-organic compounds on various substrates. They can be applied by ink jet printing as described by R. W. Vest, E. P. Tweedell and R. C. Buchanan, Int. J. (Vest et al.) of Hybrid Microelectronics 6, 261–267, 1983. Vest et al have investigated so-called MOD (Metallo-Organic Decomposition) technology over many years. The most relevant aspect of this research was reviewed in "Liquid Ink Jet Printing with MOD Inks for Hybrid Microcircuits" Teng, K. F., and Vest, R. W., IEEE Transactions on Components, Hybrids and Manufacturing Technology, 12(4), 545–549, 1987. The authors described their work on printing silver and gold conductors as well as dielectrics and resistors. MOD compounds are pure synthetic metallo-organic compounds which decompose cleanly at low temperature to precipitate the metal as the metallic element or the oxide, depending on the metal and the atmosphere. The noble metals, silver, gold and the platinum group decompose to metal films in air. The organic moiety is bonded to the metal through a heteroatom providing a weak link that provides for easy decomposition at low temperature. An oxygen bond, as in carboxylic acid-metal soaps, has been found to be satisfactory, as have amine bonds for gold and platinum.

Vest et al. investigated metallization of ceramic substrates and silicon by ink jet printing of xylene solutions of soaps such as silver neodecanoate and gold amine 2-ethylhexanoate. Images of satisfactory resolution (0.003 inches or 75 microns) were obtained, but the conductivity was low because of the extremely small thickness of the layers after decomposition which was less than a micron.

Preliminary experiments by the inventor of the present application on epoxy-glass circuit boards with silver neodecanoate solutions demonstrated that well-bonded conductors could be produced on polymer substrates. Again, the difficulty was that they were very thin and had inadequate conductivity. It was found that the addition of more MOD compound resulted in wider traces but not thicker ones. The MOD compound melts before decomposing and spreads over the surface uncontrollably. Since melting provides for a well-consolidated metal deposit after decomposition, which is desirable, and since some MOD compounds are actually liquids at room temperature, this is an unavoidable problem. A possible solution to this problem is to build up the thickness by printing many layers, which Vest et al found suitable for metallizing silicon solar cells, but this detracts from production of circuits in a single pass which is the desired result.

Similar materials and techniques have been used to apply thin film metallization and seed coatings which are then built up with solder or electroplating. U.S. Pat. No. 4,650,108, issued on Mar. 17, 1987, to B. D. Gallegher and assigned to the National Aeronautics and Space Administration, Washington, D.C.; U.S. Pat. No. 4,808,274 issued on Feb. 28, 1989, to P. H. Nguyen and assigned to Engelhard Corp. Menlo Park, N.J.; U.S. Pat. No. 5,059,242 issued on Oct. 22, 1991 to M. G. Firmstone and A. Lindley and U.S. Pat. No. 5,173,330 issued on Dec. 22, 1992, to T. Asano, S. Mizuguchi and T. Isikawa and assigned to Matsushita Electric Co, Ltd. Kadoma, Japan, are examples. However, the above described thin films alone cannot provide adequate conductivity.

A creative attempt to circumvent the resistivity problem was described in U.S. Pat. No. 4,487,811 issued on Dec. 11, 1984, to C. W. Eichelberger and assigned to General Electric Co. Schenectady, N.Y. This patent describes augmenting the conductivity by a replacement reaction of metal in the deposit by a more noble metal in solution, for example the replacement of iron by copper. In the process of doing this, the contact between particles is improved by the greater volume of the replacement metal and its greater intrinsic conductivity. A resistivity of 7.5 microhm cm was achieved, substantially better than silver-loaded epoxies, but short of the performance of thick film inks. The replacement reaction solved yet another problem of polymer inks in that the material was solderable, which conductive epoxy formulations in general are not.

Another approach to solderability was described in U.S. Pat. No. 4,548,879 issued on Oct. 22, 1985 to F. St. John and W. Martin and assigned to Rohm and Haas Co. Philadelphia, Pa. Nickel powder was coated with saturated monocarboxylic acid with ten or more carbon atoms. The coated powder was mixed with novolac epoxy resins in a butyl carbitol acetate vehicle and silk screened onto an epoxy-glass board. After curing at 165° C., the conductive trace could be solder-coated by fluxing and dipping into molten solder, while a trace made with uncoated nickel powder could not be soldered. No improvement in electrical conductivity was described with this process.

U.S. Pat. No. 4,186,244 ('244 patent) issued Jan. 29, 1980, and U.S. Pat. No. 4,463,030 ('030 patent) issued July, 31, 1984 to R. J. Deffeyes, and H. W. Armstrong and assigned to Graham Magnetics, Inc. North Richland Hills, Tex. relates to silver powder compositions having a low film-forming temperature. The silver powder was formed by decomposing dry silver oxalate in the presence of a long chain carboxylic acid, either saturated (stearic acid, palmitic acid) or unsaturated (oleic acid, linoleic acid). The acid reacted with the metal powder as it was formed to provide a protective coating on the surface and to limit the particles to sub-micron size. The particles were washed to remove excess acid and blended with an equal weight of a conventional thick film vehicle consisting of ethyl cellulose polymer binder and pine oil solvent.

The resulting ink was coated on a ceramic or polyamide substrate and heated to 250° C. in air for 30–90 seconds to convert the coated powder to a silver conductor with a conductivity of one ohm per square. The coating is said to be solderable without flux, which is believable if residual acid is acting as a flux. It is stated to be resistant to leaching in a bath of molten solder, which is unexpected, based on the well known solubility of silver in solder. The explanation may lie in the quoted conductivity, which is a thousand-fold less than that required for practical circuits.

Example I of the '244 patent indicates that the resistance of the resulting material drops markedly during the "visible fusing" period, from about 6 ohms per square to one ohm per square. The "visible fusing" period is stated to occur when the substrate is heated to 250° C. in air for 90 seconds during which the conductor pattern changes to a silvery-white color. No thickness for the deposit is stated, which would allow a calculation of the resistivity of the silver. Most thick films are of the order of 25 microns (0.001 inch) thick, and this is generally used as the standard for comparison. At 25 microns thickness one ohm per square corresponds to a resistivity of 2500 microhm cm compared to the resistivity of bulk silver which is 1.59 microhm cm. This suggests a very poorly consolidated deposit with entrained nonconducting material. Even a one micron thick film corresponds to a resistivity of 100 microhm cm. A resistance of one ohm per square is far too high for practical circuitry which typically has traces with lengths of many hundreds of squares.

The unconsolidated nature of the deposit may be due in turn to the very tenacious stearate coating on the silver particles, which is an object of the '244 and '030 patents. It is well known that stearates and similar materials, which are commonly added to silver and other powders to prevent agglomeration, are very difficult to remove, even at temperatures of 625° C. and above. If not removed, they will inhibit sintering and increase resistivity. This subject was discussed in "Effect of Particle Size Distribution in Thick Film Conductors", R. W. Vest, Proceedings of the Flat Plate Solar Array Project Research Forum on Photovoltaic Metallization Systems Nov. 15, 1983 DOE/JPL-1012-92.

A somewhat similar silver flake material was described in U.S. Pat. No. 4,859,241. The flake was prepared by milling silver powder with silver stearate surfactant in an organic solvent to produce silver stearate- coated silver flakes providing a glass-filled ink composition of superior stability. This is a common method of preparing stable powders and flakes of silver.

None of the materials or mixtures described above accomplish the goal of providing an ink which can be cured to a well-bonded, well-consolidated metallic conductor with an electrical conductivity comparable to conventional thick film inks but with a curing temperature below approximately 350° C., which is required for compatibility with conventional polymer-based circuit board substrates. None of these materials has made it possible to impact the circuit board industry with new technology for rapid production by a simple process with no hazardous waste production. A new approach to provide this low temperature capability is needed.

SUMMARY OF THE INVENTION

Briefly described, the invention comprises a mixture of a Metallo-Organic Decomposition (MOD) compound and one or more metal powders. The novel composition has unexpectedly been found to consolidate to solid metal and bond firmly to conventional polymer-based circuit board substrates at temperatures below 350° C., at which temperature the substrates can survive.

Preferably, a silver flake is added to a silver neodecanoate MOD compound to immobilize it during melting and decomposition. This material restricts the spread of the liquid MOD compound so that it is possible to screen print patterns with lines and spaces of about 0.4 mm. The resolution of the resulting conductors is such that 0.2 mm lines and spaces can be provided.

The MOD compound also improves the definition of screened circuit traces of silver flake. It has been found that silver flake mixed with α-terpineol will sinter to reasonably well-consolidated, well-bonded trace on polymer substrates, but that the mixture does not produce good screen images. The addition of the MOD compound substantially improves the quality of the screen image before heat treatment in addition to improving the bonding of the silver flake during heat treatment and its electrical conductivity afterwards.

The addition of silver flake also increased the thickness of the deposits. It has been found that a trace formed of a pure MOD compound was limited to a few microns in thickness. The addition of silver flake to the MOD compound makes it possible to produce deposits up to 50 microns (0.002") or more thick without line broadening and loss of resolution.

The MOD-metal flake mixture maintains its configuration during heating, and will decompose to form a well-bonded, well-resolved conductor at a temperature of approximately 200° C. Heating the deposit to a temperature just above about 300° C. surprisingly results in a consolidation or sintering of the deposit to near theoretical density with an electrical resistivity of less than twice that of the bulk metal and excellent mechanical properties. Preferably, a metal in the colloidal state is added to the mixture to provide a still lower temperature for consolidation. The metal in the colloidal state is preferably colloidal silver with a nominal particle size of 20 nanometers in a α-terpineol solvent. The addition of a metal in the colloidal state allows the mixture to be consolidate at a temperature of about 270° C.

The invention may be more readily understood by reference to the following drawings.

DETAILED DESCRIPTION OF THE INVENTION

During the course of this description, like numbers will be used to identify like elements according to the different figures which illustrate the invention.

The present invention relates to a composition formed of a mixture of Metallo-Organic Decomposition (MOD) compound, and a metal powder, in the form of flakes and to processes to apply it to polymer-based substrates and convert it by heating to a temperature in the range of approximately 200° C. to 350° C. to produce an electrical conductor on the substrate and to bond electrical components to the conductor.

The MOD constituent can be any compound in which a metal atom is linked to an organic moiety through a heteroatom bond weaker than the carbon-carbon bonds of the organic moiety. Examples of such MOD compounds are carboxylic acid metal soaps in which the metal atom is bonded via oxygen and which decompose readily with the evolution of carbon dioxide and hydrocarbon fragments, as well as the elemental metal. Preferably, silver neodecanoate is used as the MOD compound in the thick film composition.

Silver neodecanoate has the structure:

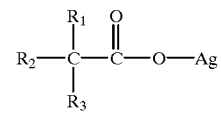

Where $R_1+R_2+R_3=C_8H_{19}$

It will be appreciated that other metals and other organic constituents such as amines can also be used as the MOD composition. A typical amine compound is gold amine 2-ethylhexanoate with the structure:

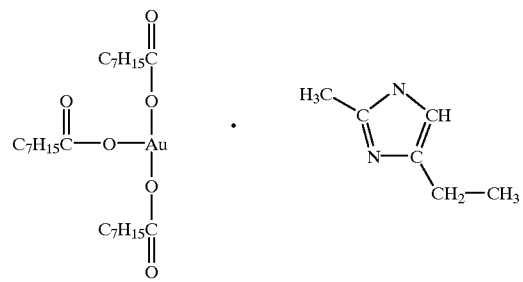

Other heteroatom linkages to the metals with sulfides and phosphides can be used in the MOD component.

The composition of this invention decomposes and consolidates to a well-bonded metallic trace on a polymer-based substrate at a temperature less than 350° C., preferably less than 300° C. and more preferably less than 275° C.

Figure 1:
FIG. 1 is a Scanning Electron Micrograph (SEM) of Aldrich Chemical Co. #32,707-7 silver flake showing its plate-like structure.

Preferably, the metal powder in the thick film composition is in the form of metal flakes with an aspect ratio, width divided by thickness, of between about 5 and about 50. Preferably, the aspect ratio is between about 10 to about 20. An example, of a metal flake is a silver flake manufactured by Aldrich shown at a magnification of 2000 in the scanning electron micrograph in FIG. 1. Another metal flake useful for practice of the present invention is a 15% silver-coated—400 mesh nickel flake as supplied by Novamet, Inc.

The amount of metal flake used in the composition can be at least equal to the amount of the MOD compound by weight and less than about ten times the amount of the MOD compound, preferably about four times the weight of the MOD compound. It has been found that the performance of the mixture is not sensitive to the amount of metal within a range of two to five times the MOD content.

The metal powder can be stabilized with a coating of surfactants, such as stearic acid, to prevent premature agglomeration of the metal particles. Such agglomeration can make the powder unfit for the purpose of this invention. Preferably, the amount of surfactant is minimized, and the use of strongly bonded surfactants which can interfere with the consolidation of the metal powder is undesirable.

A colloidal metal suspension is preferably added to the mixture of the present invention to lower the critical consolidation temperature of the thick film. The colloidal material most preferably is substantially smaller in particle size than conventional metal powders with a mean particle diameter in the range about 10 to about 40 nanometers. Preferably, the mean particle diameter is in the range of about 15 to about 30 nanometers.

The metal content of the colloidal metal suspension can be at least about 10% by weight up to about 50% by weight. Typically, this material cannot be handled as a dry powder and must be supplied as a stable suspension in a liquid compatible with the final composition. A suspension from Nanophase Technologies, Inc., 8205 S. Cass Ave. Darien, Ill. 60559 is an example of a colloidal metal suspension useful for practicing the present invention. This suspension comprises 15% by weight of 20 nm diameter silver particles in an α-terpineol vehicle. α-terpineol is also used as the preferred vehicle for the present invention. It will be appreciated that other colloidal metal suspensions in other vehicles which are known in the art can be used with the teachings of the present invention.

The vehicle used in the composition of this invention dissolves the MOD compound and suspends the metallic constituents of the mixture to provide inks and pastes that can be applied by screen printing, stencil printing, gravure printing or other direct contact printing processes. The vehicle has a low enough vapor pressure to maintain its consistency on the screen for a period of more than an hours time. Preferably, the vapor pressure is less than about 0.001 atmosphere at ambient temperature. The composition has a low enough viscosity to permit screen printing. Preferably, the viscosity is about 10 Pa seconds (100 poise) at a shear rate of about 1000 per second. Preferably, the solvent is α-terpineol. Other vehicles such as butyl carbitol can also be used. The amount of vehicle is dictated by the viscosity requirements of the printing process. Preferably, the amount of the vehicle containing the colloidal suspension is in the range of about 0.4 to about 1.5 times the MOD content of the composition by weight.

The composition of the present invention can be applied to a substrate by silk screening. Silk screening has the advantage of being convenient and widely used in the thick film industry. The mixtures can also be applied by stenciling. Stencilling has the advantage of providing finer resolution than can be provided by silk screening. Intaglio or gravure printing can be used to apply the composition of the present invention in which an etched plate is filled with ink and pressed onto the substrate to transfer the desired pattern. The thick film of the present invention can also be applied by offset lithography in which the image is made oil wetting to attract the oil-soluble ink and the background of the plate is made water wetting to repel the ink.

The mixtures of the present invention can be formed by weighing out the constituents under dry nitrogen to avoid altering the surface state of the finely divided metal powders. The mixtures are blended to a smooth, homogeneous ink on a roll mill and are then ready for use.

Following application to the substrate, the composition of this invention is converted to a well-bonded, well-consolidated metal conductor by heating in an oven. For the noble metals silver, gold and platinum, the MOD decomposition can be accomplished in air. Alternatively, the decomposition can be performed by heating in nitrogen which can improve conductivity of the silver traces.

For less noble metals such as copper and nickel, a special atmosphere is necessary with an oxygen partial pressure below the equilibrium decomposition pressure of the metal oxide to prevent oxide formation, but above the oxygen partial pressure in equilibrium with carbon and its oxides to prevent carbon formation. Mixtures of hydrogen and water vapor or CO and $CO_2$ may be used, for example.

The decomposition of the composition of the present invention is rapid and complete. A fully sintered metal trace can be produced in a heating time of less than ten minutes, preferably less than six minutes, more preferably less than five minutes.

The composition of the present invention can also be used to bond electrical components to conductors. After a conductor has been applied to a substrate as described above, the composition of the present invention can be applied to the electrical component and to the conductor and reheated for bonding the electrical component to the conductor. Alternatively, an electrical component can be adhered to an unheated circuit trace of the mixture of the present invention and the circuit trace can be converted to metal and bonded to the substrate and the component in a single oven treatment.

Unexpectedly, it has been found possible to sinter the MOD-metal flake mixture to a densified solid conductor at a temperature far lower than the melting point of the metal. Conventional sintering of metal requires temperatures near the melting point. Copper powders under pressures as high as 100,000 psi (6700 atmospheres) do not begin to compact until the temperature reaches 650° C. or 60% of the melting point. Conventional silver-based thick film pastes (melting point 962° C.) are sintered at temperatures above 850° C. at one atmosphere. The activation energy for silver sintering is 46 kcal per mole. Sintering at 325° C. should be slower than at 850° C. by a factor of seventy million, but in fact well-consolidated, well-bonded conductors can be produced, presumably because the finely divided silver flake has a higher surface energy than bulk silver, and in the MOD environment in which it is processed, it is free of coatings or surface layers that would inhibit metal-to-metal contact and consolidation. No preliminary drying step is needed in the formation of thick films. Also, the circuits do not need to be processed immediately after screening. The addition of silver flake has solved the problem of poor definition and inadequate thickness of the MOD mixture by itself, while maintaining the MOD advantages of depositing a well bonded metal image at a low enough temperature to be compatible with conventional printed circuit substrates.

The examples described below indicate how the individual constituents of the preferred mixture and the conditions of the process for applying it function to provide the desired result. The examples demonstrate that by using the composition and processes of the present invention, solid metal electrical conductors can be applied to conventional printed circuit substrates without waste and with electrical performance equivalent to thick film technology but at much lower temperatures. The examples will serve to further typify the nature of this invention but should not be construed as a limitation in the scope thereof, which scope is defined solely in the appended claims.

Figure 2:
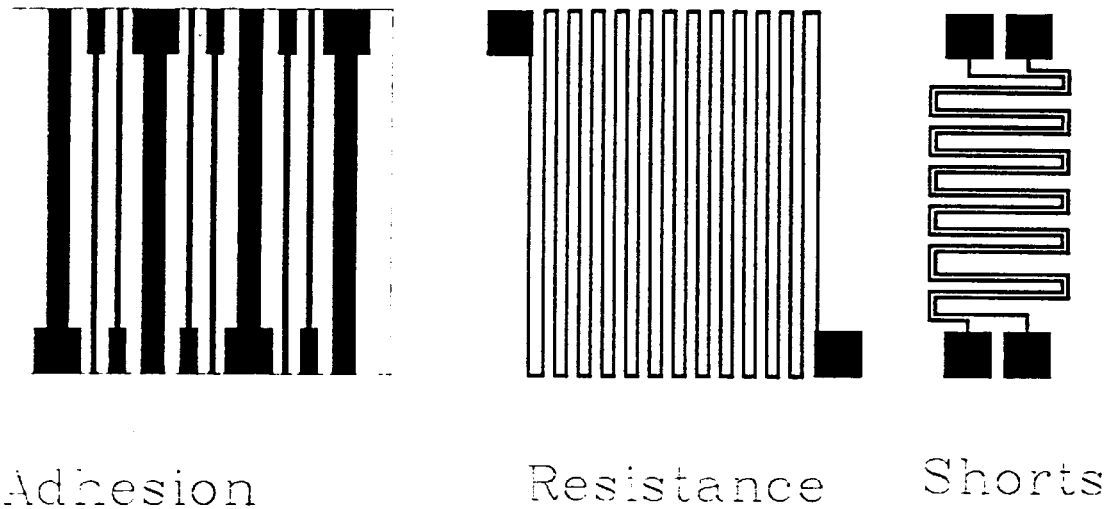
FIG. 2 is the test pattern used to measure the adhesion and resistivity of conductors prepared by the method of the present invention, and to confirm that the printed conductors can be deposited without short circuits.

In the examples, the ink is screened onto the selected polymer-based substrate using the test pattern shown in FIG. 2. The resulting screened images were heat treated in duplicate in a stationary infrared oven. They were introduced into a cold oven, and the radiant heater was operated at a power level sufficient to bring them to the desired temperature in 5–6 minutes. This simulates heating the circuits in an infrared belt furnace. The solvent is driven off at a temperature below about 200° C. at which the MOD component begins to decompose. Continued heating to a higher temperature mentioned in each example consolidates the metal conductor and bonds it to the substrate. It has been found that maintaining the peak temperatures for about one minute is sufficient for consolidation and bonding the thick film of the present invention.

Example I

A composition, labeled Ink B-2, was formed from the following mixture:

| Silver neodecanoate | 1.10 g |
|---|---|
| Silver flake, (Aldrich # 32,707-7) | 0.88 g |
| Kerosene | 0.48 g |

The constituents were blended by hand and screened onto a conventional 0.062 inch thick FR-4 epoxy-glass circuit board substrates. The samples were heated in a stationary oven for twenty minutes at a temperature measured as 185° C. This temperature could have been up to fifty degrees higher based on subsequent measurements.

Figure 3:
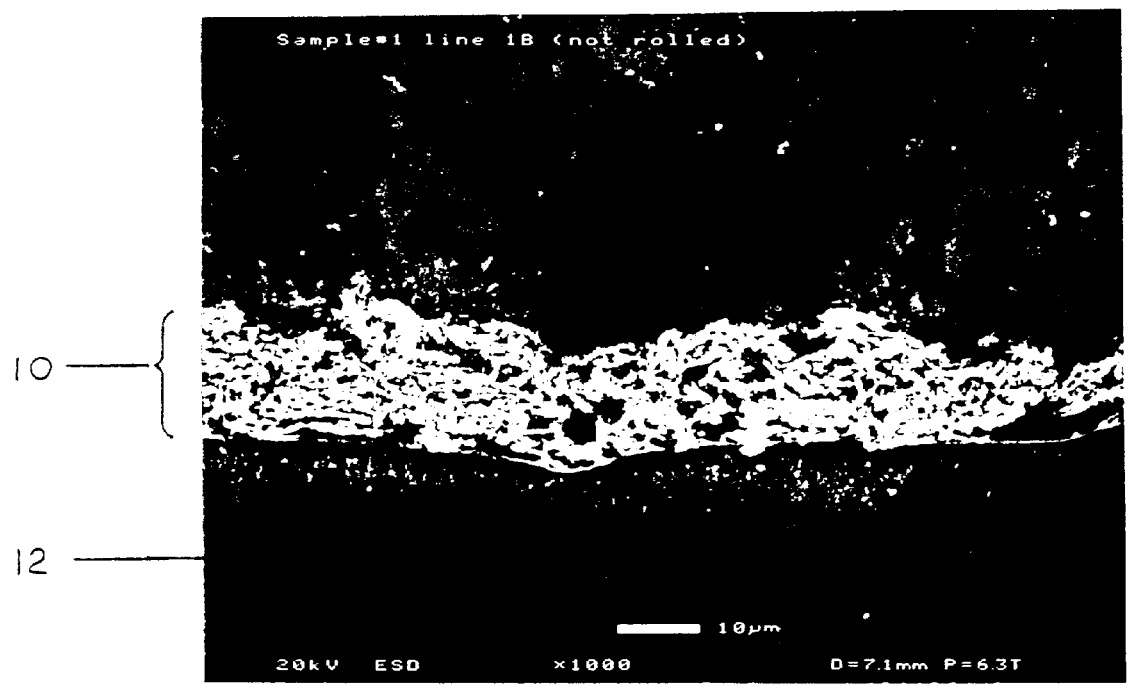
FIG. 3 is an SEM of a silver trace heat treated at 200° C. on an epoxy-glass substrate showing the unconsolidated nature of the deposit. Electrical conductivity was less than ¼ that of bulk silver and adhesion and cohesion were inadequate.

After heating, the MOD compound had completely decomposed leaving a well-defined and well-bonded image with a measured thickness of 0.0006 inches (15 microns). Scotch Tape, Commercial Office Supply Division/3M. St. Paul, Minn., was applied to the image for removal of silver flake. The measured thickness of the bonded image was reduced to 0.0003 inches. The electrical resistance of the trace measured on a pattern with a width of 0.4 mm and a length of 1.25 meters (3200 squares) was 115 ohms, corresponding to a resistivity of 54 microhm cm. A SEM photograph of composition 1 is shown in FIG. 3. While the silver image 10 is firmly adherent to the polymer substrate 12, the silver flake is poorly consolidated and full of holes and inclusions.

Example II

A composition labeled Ink B-33 was formed from the following mixture:

| Silver neodecanoate | 3 g |
|---|---|
| Aldrich silver flake (#32,707-77) | 12 g |
| α-terpineol | 1.8 g |

Figure 4:
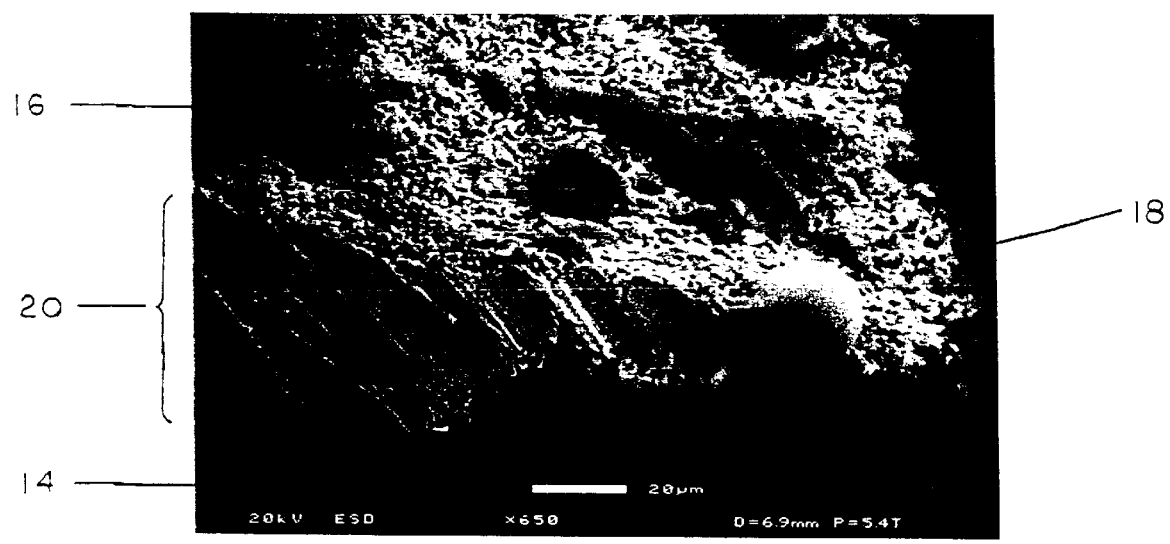
FIG. 4 is an SEM cross section of a well-consolidated deposit showing an angled cross section with the Kapton substrate below and the surface of the deposit above.
Figure 5:
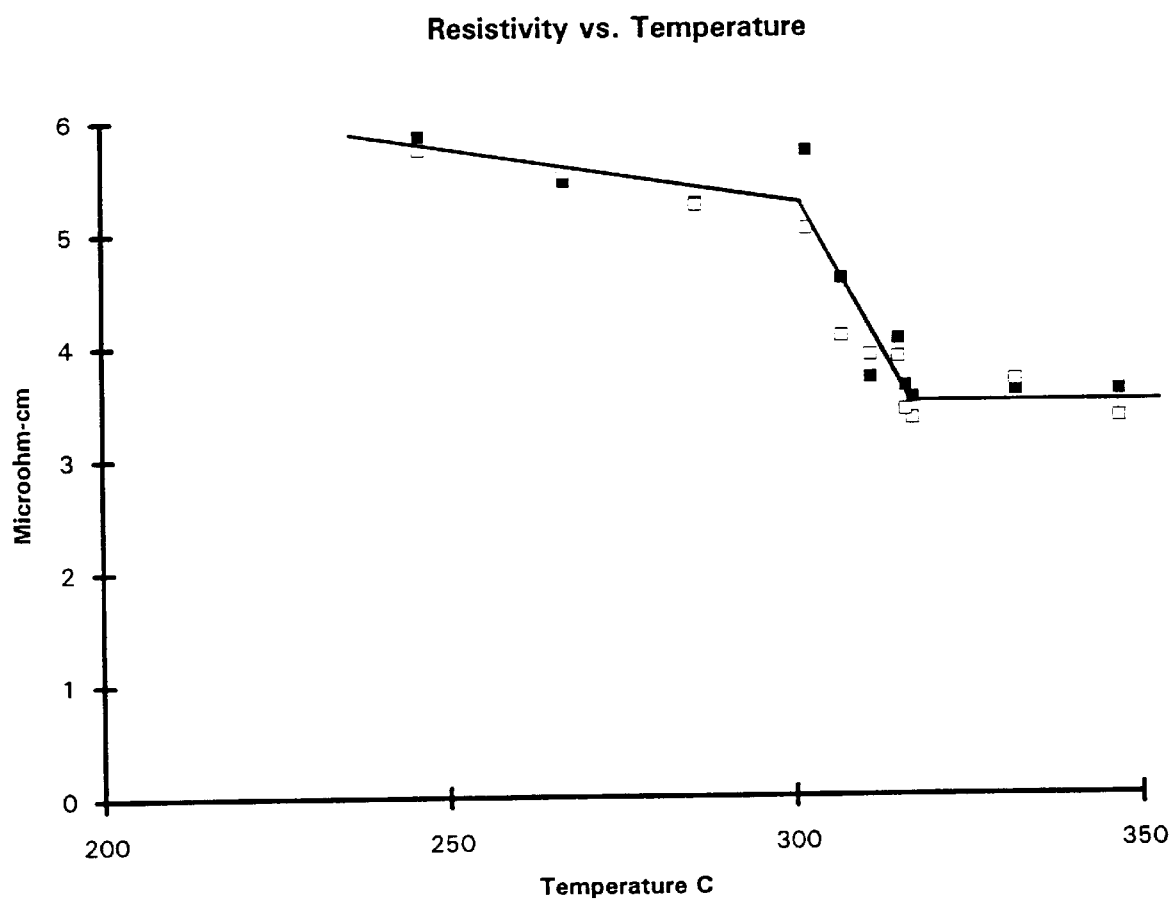
FIG. 5 is a plot of resistivity in microhm cm vs. heat treatment temperature in degrees C. for a fifteen minute heating time, an ink containing silver neodecanoate, silver flake and α-terpineol and a Kapton FN929 substrate. The critical temperature for consolidation is just over 300° C.

The constituents were weighed out under dry nitrogen and blended in the roll mill. Images were screened onto a DuPont Kapton FN 929 substrate with a semiautomatic screen printer and heated in a stationary oven as before, but with better temperature measurement and at successively higher temperatures. By this technique it was found that there is a critical temperature above which the metal consolidates to a nearly solid form, shown in the SEM cross section of FIG. 4. The sample is inclined with the Kapton substrate at 14, the surface of the silver deposit at 16, the edge of the silver at 18, and a cross-section of the deposit showing the degree of consolidation at 20. The measured electrical resistivities of the test conductors are shown as a function of maximum oven temperature in FIG. 5. Duplicate samples were heated in a stationary oven in air, and the two resistivity values are plotted as solid and hollow squares. There is a sharp break downward in resistivity at an oven temperature just above 300° C. At higher temperatures, the electrical resistivity of the printed and heat treated test conductor was 3 microohm cm, compared to bulk silver at 1.59 microhm cm.

Example III

By adding an even finer colloidal silver with a mean particle diameter of approximately 20 nanometers it has been found possible to lower the temperature for consolidating the metal still further to 270° C., as shown in the following example.

A composition labelled Ink B-45 was formed from the following mixture:

| silver neodecanoate | 3 grams |
|---|---|
| silver flake, Aldrich Chemical Co. Catalog No. 32,707 | 12 grams |
| colloidal silver suspension* | 1.8 grams |

*Nanophase Technologies 15% by weight of 20 nanometer diameter colloidal silver suspended in α-terpineol.

The ingredients were weighed out and mixed under dry, high purity nitrogen. The mixture was blended for fifteen minutes in a two roll mill to prepare a smooth, uniform ink. The ink was screen printed to produce a final thickness of silver of 10–15 microns on samples of DuPont Kapton 300 FN 929. The printed pattern was a conductivity test pattern with a line width of 0.4 mm and a length of 1.25 m (3200 squares).

Three tests for mechanical properties were also performed on the samples.

1) A mandrel test in which the sample was bent around a ⅛ inch mandrel.
2) A tape test in which tape was pressed down on the sample.
3) A crease test in which a 180° crease was formed in the sample.

The results of resistivity and mechanical properties vs. oven temperature were as follows:

| Resistivity (Microhm cm) | Silver mass (Milligrams) | Temperature (° C.) | Conditions |
|---|---|---|---|
| 5.26, 4.85 | 77, 75 | 228 | Fails ⅛" mandrel test |
| 5.21, 6.35 | 77, 84 | 256 | Pass mandrel, fail tape |
| 3.15, 3.24 | 75, 83 | 275 | Pass tape, pass 180° crease |
| 3.33, 3.39 | 84, 89 | 300 | Pass tape, pass crease |
| 2.11, 2.94 | 55, 73 | 327 | Pass tape, ¾ pass crease |

Figure 6:
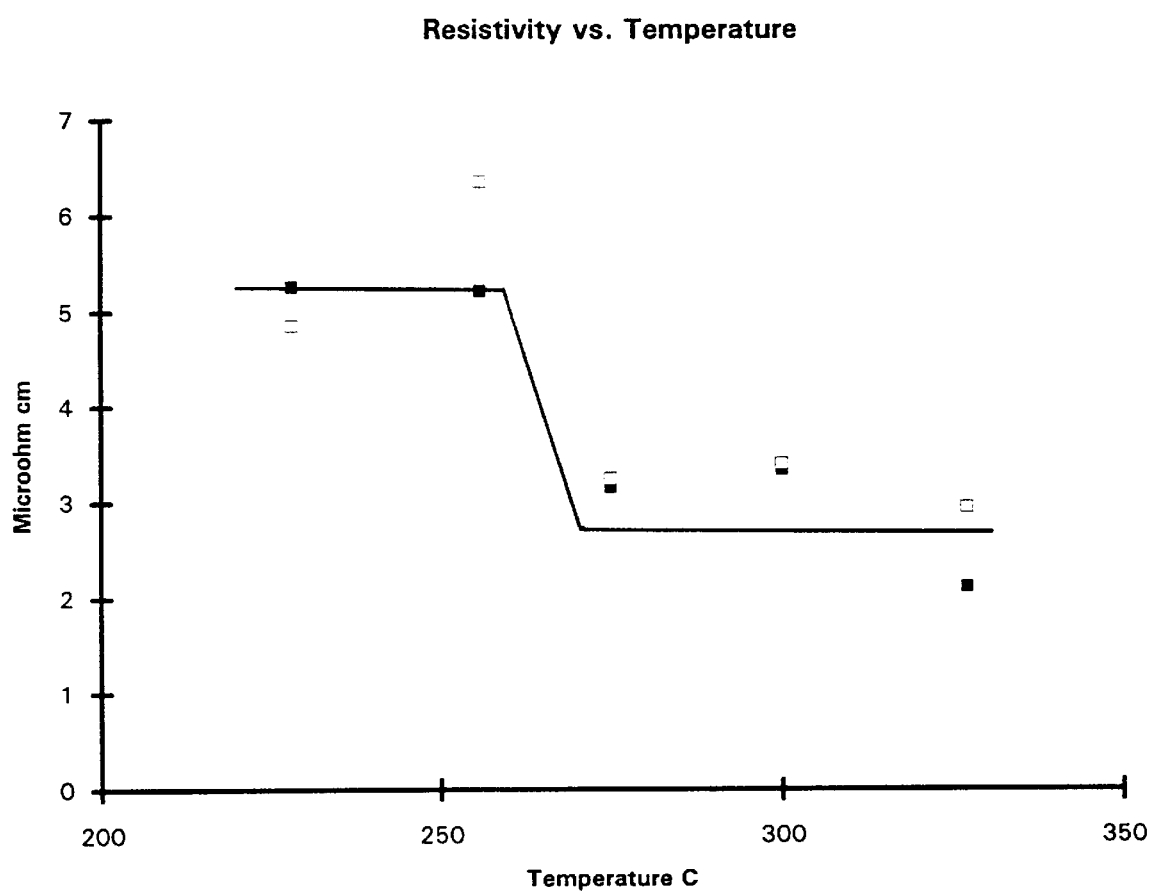
FIG. 6 is a plot of resistivity in microhm cm vs. heat treatment temperature in degrees C. for a six minute heating time, an ink containing silver neodecanoate, silver flake and colloidal silver suspension and a Kapton FN929 substrate. The critical temperature for consolidation is reduced to 270° C.

The resistivity results are plotted in FIG. 6. The resistivity dropped sharply at a temperature between 256° and 275° C., as was earlier observed at a higher temperature. The lower temperature is attributed to the presence of the colloidal silver, since the silver flake was from the same batch as used in the previous examples. The mechanical properties of the silver deposit improved at the same critical temperature as the electrical properties. At the lowest temperature, the deposit flaked off the substrate when bent around a ⅛ diameter mandrel. At 256° C. the deposit passed the mandrel test but failed the "Tape" test in which "Scotch" Tape is pressed down on the deposit and peeled off. The deposit fails if it peels off the substrate. At 275° C. and above where the resistivity had decreased, the deposit passed the tape test, and withstood a 180 degree crease in the substrate, the 180° crease test is a severe test requiring adhesion and ductility in the deposit.

The effect of the individual constituents of the mixture labeled ink B-45 are shown independently in the following two examples.

Example IV

A composition labeled Ink B-50 was formed from the following mixture:

| | |
|---|---|
| Silver Flake | 12 grams |
| Colloidal silver suspension (Nanophase) | 1.8 grams |
| α-terpineol | 0.466 grams |

Figure 7:
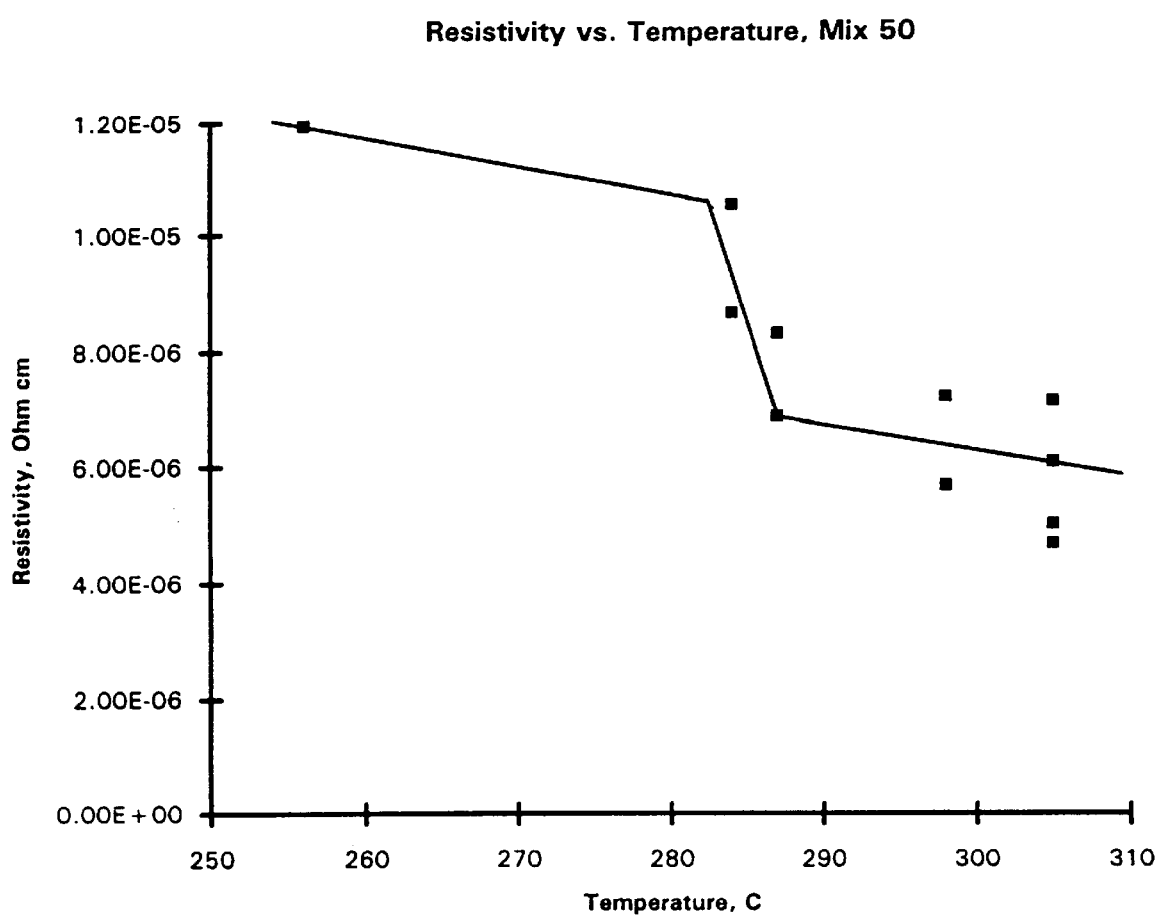
FIG. 7 is a plot of resistivity in microhm cm vs. heat treatment temperature in degrees C. for a five minute heating time, an ink containing silver flake and colloidal silver suspension, (no MOD compound) and a Kapton FN 929 substrate, showing low critical consolidation temperature but high resistivity.

The constituents were weighed, blended and screened as above. The mixture without the MOD component is very different in consistency, being a stiff, noncohesive paste. Additional α-terpineol was added during roll milling to make the material more screenable. The extra liquid vehicle provided better images than previous mixtures without MOD, but the fired images were rougher and thicker than the images formed in Example III. Approximately twice as much silver was deposited per unit length of the conductor. The electrical resistivity is shown in FIG. 7.

The critical temperature for consolidation of the metal was between 280° C. and 290° C. and the physical properties of the conductors were good at higher temperatures. The resistivity was significantly higher than when the MOD compound was present. The results indicate that the MOD compound assists in producing a well-consolidated conductor with a low resistivity, as well as acting as a surfactant and viscosity modifier to provide high quality printed images.

Example V

A composition labeled Ink B-49 was formed from the following constituents:

| | |
|---|---|
| Silver neodecanoate | 3 grams |
| Silver flake | 12 grams |
| α-terpineol | 1.8 grams |

Figure 8:
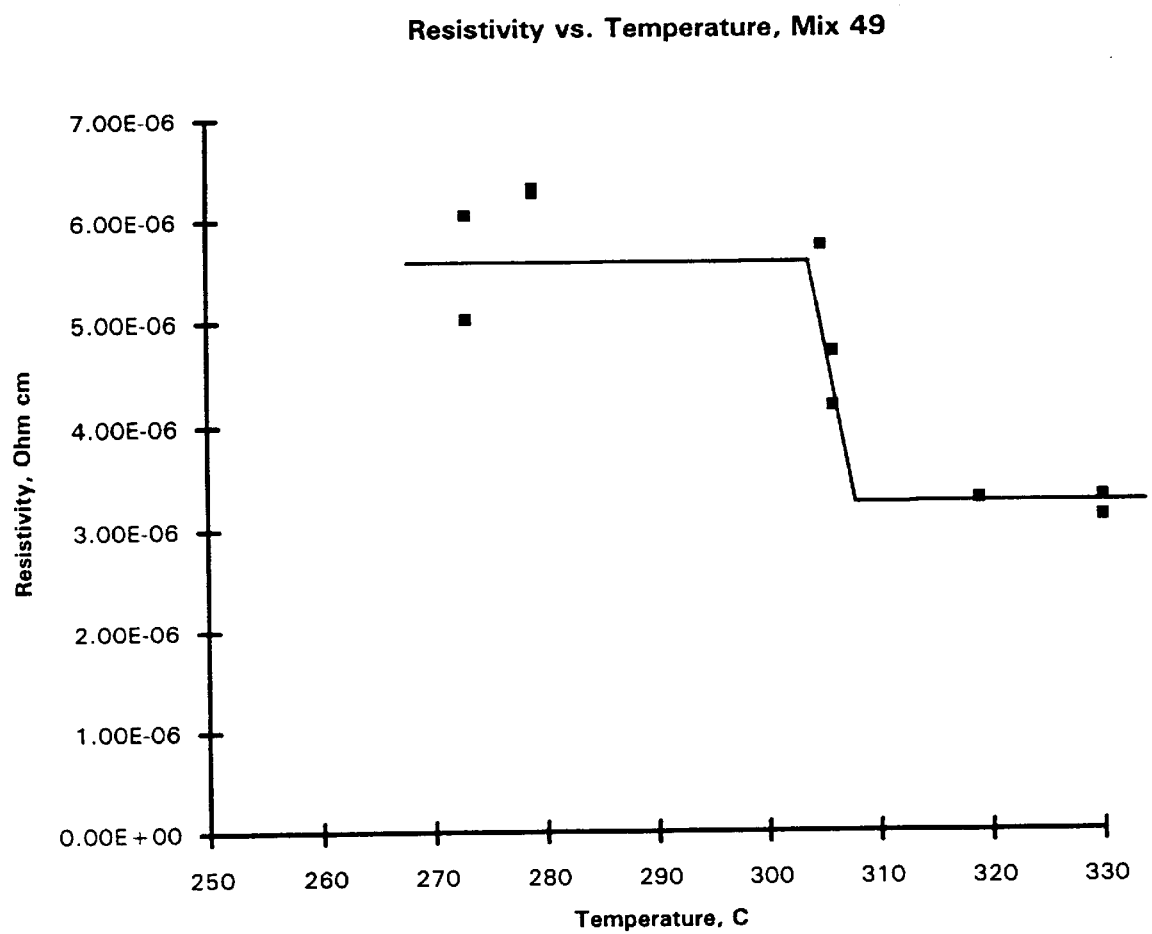
FIG. 8 is a plot of resistivity in microhm cm vs. heat treatment temperature in degrees C. for a five minute heating time, an ink containing silver flake, silver neodecanoate and α-terpineol (no colloidal silver) and a Kapton FN 929 substrate, showing low resistivity but high critical consolidation temperature.

The mixture was weighed, blended and screened as before. The electrical resistivity as a function of heating temperature is shown in FIG. 8. It can be seen that the critical temperature for consolidation is over 300° C., but that the absolute value of the resistivity is as low as with the mixture formed in Example III. From this example, it is found that the role of the colloidal silver is to lower the critical temperature.

The conductors produced by the compositions and processes of the present invention are well-consolidated and well-bonded to epoxy-glass circuit boards as well as to Teflon-coated Kapton polyamide films as shown in the following examples.

Example VI

A screen ink with the same constituents as Ink B-45 described in Example V was prepared in the same way and screened onto substrate formed of an Allied Signal Advanced Materials FR 406 epoxy-glass rigid laminate. The same pattern was used but with a screen giving a nominal 17 micron thick trace. The samples were heated in a nitrogen atmosphere in a belt furnace with a six minute heating cycle, and with approximately a minute duration at maximum temperature. The resistivity is shown below.

| Resistivity (microhm cm) | Maximum temperature (° C.) |
|---|---|
| 7.17, 7.25 | 260 |
| 5.69, 5.61 | 265 |
| 3.04, 3.18, 3.22 slight darkening | 270 |

The same sharp reduction in resistivity as with Kapton substrates, shown in Example V is seen at 270° C. at which temperature the laminate still retained its integrity. It was found that at 290° C. the substrate delaminated and discolored.

Example VII

An adhesion pattern from the Military Specification MIL-S-13949H was screen printed on a Kapton FN substrate using the same mixture as Example III.

The conductors could not be peeled off the substrate without breaking them, since, unlike conventional copper foil conductors, the cohesion of the deposited silver conductor is the same or less than its adhesion. The peel strength of the conductors was therefore measured by peeling the substrate off the conductor after cementing the conductors to an aluminum backing and scoring along the sides of the conductor strips. The ⅛ inch wide strips in the pattern were used. The range of results is presented below as Newtons force per meter of conductor width.

Peel Strength Tests—Screen Printed Kapton Samples

| Sample no. | Newtons/meter |
|---|---|
| B-40-1 | 250–400 |
| | 250–310 |
| | 250–525 |
| B-40-2 | 310–525 |
| | 400–620 |
| | 250–620 |
| B-40-3 | 220–460 |
| | 400–620 |
| | 400–620 |
| B-40-4 | 460–560 |
| | 460–680 |
| | 250–525 |

The results indicate significant adhesion of the deposited traces. Surface analysis of the separated traces and substrates shows fluorine in approximately equal amounts on each side of the separation, suggesting that the failure occurred at least partly in the Fluorinated Ethylene Propylene (FEP) Teflon coating on the substrate.

Example VIII

The ink described in Example I was screened onto FR-4 epoxy-glass laminate for peel strength testing. As with Kapton, it proved impossible to peel the conductors from the substrate without breaking them. To measure the strength of the metal-substrate bond glass cloth was cemented to the conductors with high strength epoxy and scored along the conductor trace. When the glass cloth was pulled form the surface the following peel strengths were recorded:

Peel Strength Tests--Epoxy-Glass Samples

| Sample No. | Newtons/Meter, Range | Majority of Data and Remarks |
| --- | --- | --- |
| B-9-1 | 1390–2320 | |
| | 775–1700 | Pulled the board apart |
| | 1080–2630 | 1500–1600, removed metal |
| | 620–2630 | 1500–1600, pulled board apart |
| B-9-2 | 620–2160 | 1550–1850 |
| | 930–2160 | 1235–1550 |
| | 930–2475 | 1235–1550 |
| | 930–1850 | 930–1235 |

In all cases the metal-epoxy bond was far stronger than the metal-Teflon bond of Example III. The metal was so firmly anchored that in some tests the substrate actually delaminated before the bond broke.

In addition to providing conductors bonded to polymer substrates, the thick film mixtures of the present invention can also be used to bond electrical leads from components to the conductors, thereby facilitating assembly of the circuit as well as making the circuit board. The following example illustrates this application.

Example IX

Figure 9:
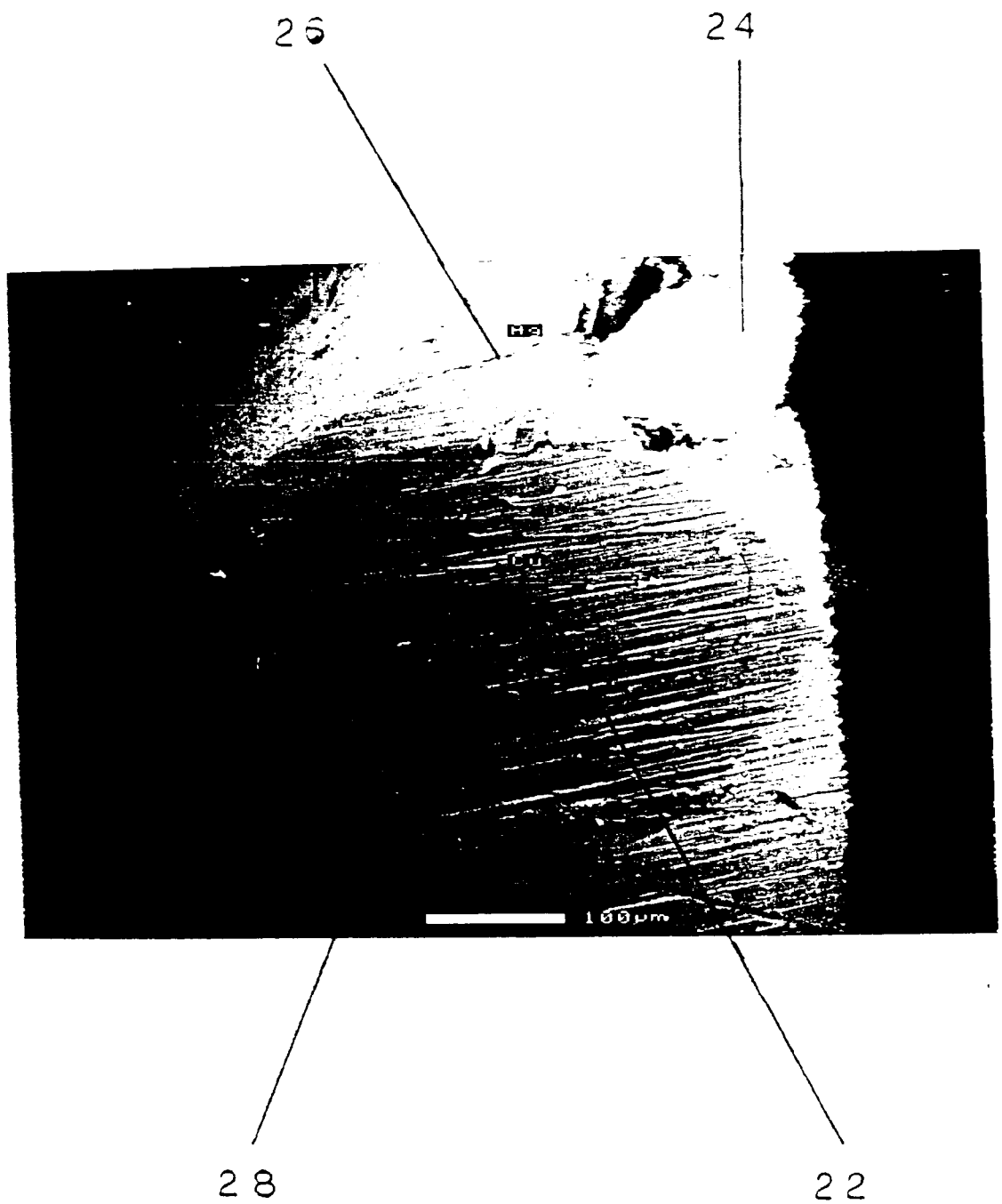
FIG. 9 is an SEM of a 0.010 inch (0.25 mm) diameter copper wire bonded to a silver interconnect with additional silver-MOD mixture showing an excellent bond between the two metals and the well-consolidated nature of the silver deposit.

An ink formed as in Example III was prepared screened and heated as above. Additional ink was used to secure a copper wire 22 with a diameter of 0.010 inch (0.25 mm) to one of the circuit traces. The circuit was reheated with the same time-temperature profile and the copper wire was sectioned and photographed with the SEM. The result is shown in FIG. 9. The silver deposit was consolidated with no evidence of the interface between the first layer of silver 24 and the second layer 26. The bond to the copper wire 28 was intimate and without voids or inclusions, despite the absence of precautions such as fluxes or protective atmospheres. The wire was solidly bonded, and when pulled off the circuit, it removed some of the silver with it.

Figure 10:
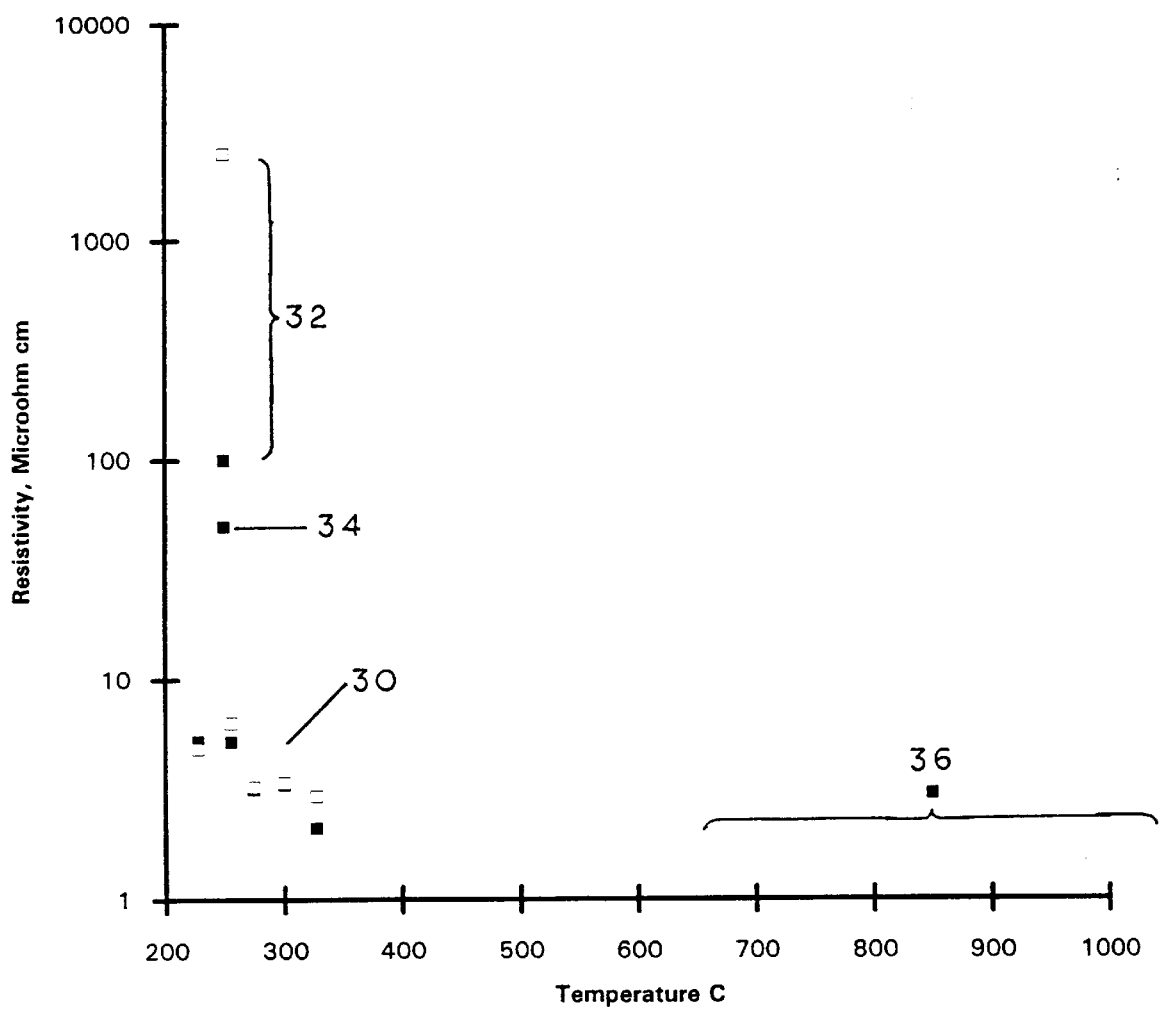
FIG. 10 is a replot of the data in FIG. 6 showing the relation between the results obtained with the mixtures of this invention and those with the mixture of the composition of U.S. Pat. Nos. 4,186,244 and 4,463,030, with conventional conductive epoxies and with conventional thick film inks. The resistivity is plotted on a logarithmic scale.

The relationship of conductors produced from the mixtures of the present invention to those available in the prior art, and to U.S. Pat. No. 4,463,030, is shown in FIG. 10. Conductors 30 of the present invention at low temperature have less resistivity than conductors 32 corresponding to the '030 patent and conventional conductive epoxies 34. They can achieve equally low resistivities at dramatically lower temperatures than conventional thick film pastes 36. The mixtures of the present invention make possible the creation of practical printed circuits in a region of high electrical conductivity and low processing temperature hitherto unattainable.

The compositions and the processes for applying them to polymer substrates of the present invention have the advantage of providing novel capabilities for creating electrically conductive patterns and coatings on various plastic substrates. The conductors of the present invention are pure metals or alloys with no admixtures of polymer or glass binding agents, and therefor provide an unexpected level of electrical conductivity. The compositions can be applied in layers of an arbitrary thickness offering significant current carrying capacity. The compositions can be applied only where needed and only in the amount desired in the substrate by various printing technologies with no hazardous waste generation. The present invention is applicable to a number of metals and all the conventional printed circuit substrate materials. The compositions of the present invention can also be used to create electrical resistors, dielectrics, decorative coatings and optical coatings.

While the invention has been described with reference to the preferred embodiment thereof, it will be appreciated by those of ordinary skill in the art that modifications can be made to the structure and elements of the invention without departing from the spirit and scope of the invention as a whole.

I claim:

1. A conductive thick film composition comprising a mixture of:
   a metallo-organic decomposition (MOD) compound;
   a first metal powder with a particle thickness of about $1\mu$ in an amount of about 1 to about 10 times the amount of the MOD compound by weight; and,
   an organic liquid vehicle in an amount of about 0.4 to 1.5 times the MOD compound by weight.

2. The composition of claim 1 wherein said first metal is selected from the group consisting of: copper, silver, gold, zinc, cadmium, palladium, iridium, ruthenium, osmium, rhodium, platinum, iron, cobalt and nickel, (Groups Ib, IIb and VIII), and indium, tin, antimony, lead and bismuth.

3. The composition of claim 2 wherein said first metal is silver, gold or platinum.

4. The composition of claim 1 wherein said first metal is in the form of metal flakes with an aspect ratio of between about 5 and about 50.

5. The composition of claim 1 wherein said first metal is in the form of metal flakes with an aspect ratio of between about 10 and about 20.

6. The composition of claim 1 wherein said first metal is in an amount of about 4 times the amount of the MOD compound by weight.

7. The composition of claim 1 further including:
   a second metal in colloidal form comprising about 15% by weight of 20 nanometer diameter metal particles in said organic liquid vehicle.

8. The composition of claim 7 wherein said second metal is selected from the group consisting of: copper, silver, gold, zinc, cadmium, palladium, iridium, ruthenium, osmium, rhodium, platinum, iron, cobalt and nickel, (Groups Ib, IIb and VIII), and indium, tin, antimony, lead and bismuth.

9. The composition of claim 8 wherein said second metal is taken from the group comprising: silver, gold or platinum.

10. The composition of claim 1 wherein the MOD compound is silver neodecanoate.

11. The composition of claim 1 wherein the MOD compound is gold amine 2-ethyl hexanoate.

12. The composition of claim 1 wherein the MOD compound is platinum amine 2-ethyl hexanoate.

13. A conductor formed from the composition of claim 1.

14. The conductor of claim 13 having an electrical resistivity less than one half the bulk value of said first and second metals.

* * * * *